United States Patent
Clark, Jr. et al.

(10) Patent No.: US 9,397,086 B2
(45) Date of Patent: Jul. 19, 2016

(54) PASSIVE DEVICES FOR FINFET INTEGRATED CIRCUIT TECHNOLOGIES

(71) Applicant: International Business Machines Corporation, Armonk, NY (US)

(72) Inventors: William F. Clark, Jr., Essex Junction, VT (US); Robert J. Gauthier, Jr., Hinesburg, VT (US); Junjun Li, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/824,560

(22) Filed: Aug. 12, 2015

(65) Prior Publication Data

US 2015/0348959 A1 Dec. 3, 2015

Related U.S. Application Data

(62) Division of application No. 13/431,347, filed on Mar. 27, 2012, now Pat. No. 9,219,056.

(51) Int. Cl.
| | |
|---|---|
| *H01L 27/06* | (2006.01) |
| *H01L 27/02* | (2006.01) |
| *G06F 17/50* | (2006.01) |
| *H01L 21/8249* | (2006.01) |
| *H01L 21/84* | (2006.01) |
| *H01L 29/06* | (2006.01) |
| *H01L 27/12* | (2006.01) |

(52) U.S. Cl.
CPC ........ *H01L 27/0262* (2013.01); *G06F 17/5072* (2013.01); *H01L 21/8249* (2013.01); *H01L 21/845* (2013.01); *H01L 27/0255* (2013.01); *H01L 27/06* (2013.01); *H01L 27/1211* (2013.01); *H01L 29/06* (2013.01)

(58) Field of Classification Search
CPC ... H01L 27/0262; H01L 21/845; H01L 27/06; H01L 27/1211; H01L 27/0255
See application file for complete search history.

(56) References Cited

U.S. PATENT DOCUMENTS

| | | |
|---|---|---|
| 3,986,904 A | 10/1976 | Beasom |
| 4,318,751 A | 3/1982 | Horng |
| 4,965,872 A | 10/1990 | Vasudev |

(Continued)

OTHER PUBLICATIONS

C. C. Russ et al., "ESD Evaluation of the Emerging MuGFET Technology," IEEE Transactions on Device and Materials Reliability, vol. 7, No. 1, Mar. 2007, pp. 152-161.

(Continued)

*Primary Examiner* — Thomas L Dickey
*Assistant Examiner* — Damon Hillman
(74) *Attorney, Agent, or Firm* — Scully, Scott, Murphy & Presser, P.C.; Steven J. Meyers (57) ABSTRACT

Device structures, design structures, and fabrication methods for passive devices that may be used as electrostatic discharge protection devices in fin-type field-effect transistor integrated circuit technologies. A portion of a device layer of a semiconductor-on-insulator substrate is patterned to form a device region. A well of a first conductivity type is formed in the epitaxial layer and the device region. A doped region of a second conductivity type is formed in the well and defines a junction with a portion of the well. The epitaxial layer includes an exterior sidewall spaced from an exterior sidewall of the device region. Another portion of the device layer may be patterned to form fins for fin-type field-effect transistors.

15 Claims, 8 Drawing Sheets

(56) References Cited

U.S. PATENT DOCUMENTS

| | | |
|---|---|---|
| 5,047,355 A | 9/1991 | Huber et al. |
| 5,930,648 A | 7/1999 | Yang |
| 6,097,068 A | 8/2000 | Brown et al. |
| 6,448,114 B1 | 9/2002 | An et al. |
| 6,861,680 B2 | 3/2005 | Ker et al. |
| 6,879,000 B2 | 4/2005 | Yeo |
| 7,067,371 B2 | 6/2006 | Ning et al. |
| 7,141,459 B2 | 11/2006 | Yang et al. |
| 7,173,310 B2 | 2/2007 | Voldman et al. |
| 7,368,354 B2 | 5/2008 | Anderson et al. |
| 7,538,351 B2 | 5/2009 | Chen et al. |
| 7,700,449 B2 | 4/2010 | Lee |
| 7,838,939 B2 | 11/2010 | Russ et al. |
| 7,910,423 B2 | 3/2011 | Ohara |
| 7,919,816 B2 | 4/2011 | Gossner et al. |
| 7,923,266 B2 | 4/2011 | Thijs et al. |
| 2002/0084490 A1 | 7/2002 | Ker et al. |
| 2004/0173850 A1 | 9/2004 | Yeo |
| 2004/0180478 A1 | 9/2004 | Yang et al. |
| 2005/0236669 A1 | 10/2005 | Chien |
| 2006/0084212 A1 | 4/2006 | Anderson et al. |
| 2006/0141706 A1 | 6/2006 | Hong |
| 2007/0262386 A1 | 11/2007 | Gossner et al. |
| 2007/0267700 A1 | 11/2007 | Russ et al. |
| 2007/0281446 A1 | 12/2007 | Winstead et al. |
| 2007/0296033 A1 | 12/2007 | Park et al. |
| 2008/0073712 A1 | 3/2008 | Maeda |
| 2009/0179268 A1 | 7/2009 | Abou-Khalil et al. |
| 2009/0289304 A1 | 11/2009 | Pouydebasque et al. |
| 2009/0309167 A1 | 12/2009 | Russ et al. |
| 2010/0155776 A1 | 6/2010 | Lee |
| 2010/0155842 A1 | 6/2010 | Anderson et al. |
| 2010/0267212 A1 | 10/2010 | Morris |
| 2010/0296213 A1 | 11/2010 | Lee et al. |
| 2012/0043611 A1 | 2/2012 | Mouli et al. |
| 2013/0256749 A1 | 10/2013 | Clark, Jr. et al. |

OTHER PUBLICATIONS

International Searching Authority, International Search Report and Written Opinion issued in International Application No. PCT/US2013/030128 Dated May 21, 2013.

Notice of Allowance dated Aug. 17, 2015 received in the parent application, U.S. Appl. No. 13/431,347.

PASSIVE DEVICES FOR FINFET INTEGRATED CIRCUIT TECHNOLOGIES

BACKGROUND

The present invention relates to semiconductor device fabrication and, more specifically, to passive devices for fin-type field-effect transistor (FinFET) integrated circuit technologies, design structures for passive devices for use in FinFET integrated circuit technologies, and methods of fabricating passive devices for use in FinFET integrated circuit technologies.

A chip may be exposed to random electrostatic discharge (ESD) events that can direct potentially large and damaging ESD currents to the integrated circuits of the chip. Manufacturers, assemblers, and users of chips often take precautions to avoid causing ESD events or to militate against the effect of an ESD event. One such precaution is to incorporate an ESD prevention circuit into the chip. The ESD protection circuit prevents damage to the sensitive devices of the integrated circuits during post-manufacture handling. The ESD protection circuit may also function to protect the integrated circuits while the chip is installed on a circuit board or other carrier.

In the absence of an ESD event, the ESD protection circuit maintains an ESD protection device in a high-impedance, non-conductive state in which the ESD protection device is electrically isolated from the protected internal circuits. If an ESD event occurs, the ESD protection device is triggered by the ESD protection circuit to change from its non-conductive state to a low-impedance, conductive state. In its conductive state, the ESD protection device directs the ESD current to ground and away from the sensitive devices in the integrated circuits on the chip. The ESD protection device clamps the ESD protection device in its conductive state until the ESD current is drained and the ESD voltage is discharged to an acceptable level.

FinFETs are non-planar devices for use in an integrated circuit of a chip that are capable of being more densely packed than traditional planar complementary metal-oxide-semiconductor (CMOS) transistors. In addition, a FinFET also offers superior short channel scalability, reduced threshold voltage swing, higher mobility, and the ability to operate at lower supply voltages than traditional planar CMOS transistors. Each FinFET features a narrow vertical fin of semiconductor material and a gate electrode that intersects a central channel of the fin. A thin gate dielectric layer separates the gate electrode from the fin. Heavily-doped source and drain regions are formed at opposite ends of the fin and border the central channel.

Improved device structures, fabrication methods, and design structures are needed for passive devices in FinFET integrated circuit technologies.

SUMMARY

According to one embodiment of the present invention, a device structure includes a device region comprised of a portion of a device layer of a semiconductor-on-insulator substrate, an epitaxial layer on the device region, a well of a first conductivity type in the epitaxial layer and the device region, and a doped region of a second conductivity type in the well that defines a junction with a portion of the well. The epitaxial layer includes an exterior sidewall spaced from an exterior sidewall of the device region.

According to another embodiment of the present invention, a method is provided for fabricating method of fabricating a device structure. The method includes patterning a portion of a device layer of a semiconductor-on-insulator substrate to form a device region, forming an epitaxial layer on the device region and having an exterior sidewall laterally spaced from an exterior sidewall of the device region, and forming a well of a first conductivity type in the epitaxial layer and the device region. The method further includes forming a doped region of a second conductivity type in the well that defines a junction with a portion of the well.

According to another embodiment of the present invention, a design structure is provided that is readable by a machine used in design, manufacture, or simulation of an integrated circuit. The design structure includes a device region comprised of a portion of a device layer of a semiconductor-on-insulator substrate, an epitaxial layer on the device region, a well of a first conductivity type in the epitaxial layer and the device region, and a doped region of a second conductivity type in the well that defines a junction with a portion of the well. The epitaxial layer includes an exterior sidewall spaced from an exterior sidewall of the device region. The design structure may comprise a netlist. The design structure may also reside on storage medium as a data format used for the exchange of layout data of integrated circuits. The design structure may reside in a programmable gate array.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
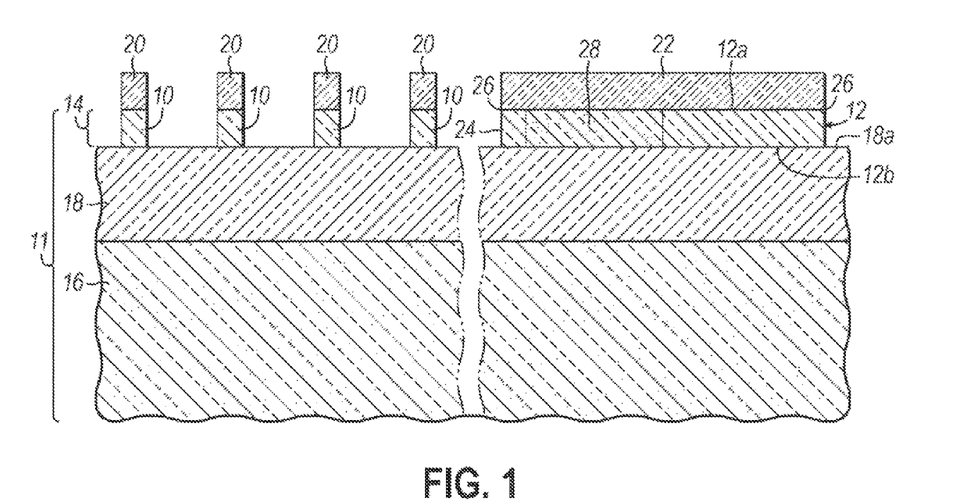
FIGS. 1-4 are cross-sectional views of different portions of a substrate at successive fabrication stages of a processing method for forming one or more FinFETs and a passive device in accordance with an embodiment of the invention.

With reference to FIG. 1 and in accordance with an embodiment of the invention, a plurality of fins 10 for constructing one or more fin-type field-effect transistors (FinFETs) and a device region 12 used to construct a passive device are formed from a device layer 14 of a semiconductor-on-insulator (SOI) substrate 11. The SOI substrate 11 also includes a handle wafer 16 and a buried insulator layer 18 comprised of an electrical insulator. The buried insulator layer 18 may be a buried oxide layer comprised of silicon dioxide (e.g., $SiO_2$). The device layer 14 is separated from the handle wafer 16 by the intervening buried insulator layer 18 and is in direct contact along a planar interface with a top surface 18a of the buried insulator layer 18. The handle wafer 16 and device layer 14 may be comprised of single crystal or monocrystalline semiconductor material, such as single crystal silicon or another crystalline semiconductor material that contains primarily silicon. The device layer 14, which may be comprised of device-quality semiconductor material, may have a thickness ranging from two (2) nm to 150 nm. The buried insulator layer 18 electrically insulates the handle wafer 16 from the device layer 14, which is considerably thinner than the handle wafer 16. The SOI substrate 11 may be fabricated by any suitable conventional technique, such as wafer bonding techniques or separation by implantation of oxygen (SIMOX) techniques, familiar to a person having ordinary skill in the art.

The fins 10 and the device region 12, which have nominally equal thicknesses at this fabrication stage, are covered by respective dielectric caps 20, 22. In one embodiment, the dielectric caps 20, 22 may be comprised of $SiO_2$. The fins 10 and the device region 12, as well as dielectric caps 20, 22, may be formed by photolithography and subtractive etching processes. To that end, the unpatterned device layer 14 is covered by a layer of a suitable cap material that etches selectively to (i.e., at a higher etch rate than) the semiconductor material comprising the device layer 14. The cap material layer may be, for example, $SiO_2$ grown by thermally oxidizing the device layer 14 with a wet or dry oxidation process. The dielectric caps 20, 22 are comprised of respective portions of the cap material layer.

The fins 10 may be formed using, for example, a sidewall image transfer (SIT) process. A layer of a sacrificial material, such as polysilicon, is deposited on the top surface of the cap material layer. The sacrificial material layer is patterned to define mandrels in the region of the device layer 14 used to form the fins 10. Spacers are then formed on the sidewalls of the mandrels. The mandrels are arranged such that the spacers are formed at the intended locations for the fins 10. The spacers may be formed from a sacrificial material that is shaped by an anisotropic etching process, such as RIE, that preferentially removes the dielectric material from horizontal surfaces. The sacrificial material used to form the spacers may comprise, for example, silicon nitride ($Si_3N_4$) conformally deposited by chemical vapor deposition (CVD). The mandrels are then selectively removed relative to the spacers using an etching process, such as RIE. The cap material layer and the device layer 14 are patterned with an etching process, such as RIE, using one or more etching chemistries while each spacer operates as an individual etch mask for one of the fins 10 and its dielectric cap 20. The etching process stops on the top surface 18a of the buried insulator layer 18. The spacers are removed from their respective locations atop the dielectric caps 20.

Each of fins 10 is constituted by a three-dimensional block of semiconductor material originating from the device layer 14 and each of the fins 10 is covered by one of the dielectric caps 20. Each of the fins 10 has a bottom surface that is in direct contact with a top surface 18a of the buried insulator layer 18.

During the SIT process forming the fins 10, a resist mask is applied to cover the device region 12 and the overlying cap material layer. After the SIT process is completed, the resist mask is removed, and the device layer 14 and cap material layer are then patterned with photolithography and subtractive etching processes to form the device region 12. In one embodiment, a resist layer is applied on the cap material layer by spin coating, pre-baked, exposed to radiation projected through a photomask to impart a latent image of a pattern that retains the resist at the intended location of the device region 12, and then developed with a chemical developer. The resist layer supplies a protective block mask covering the fins 10. The device region 12 and dielectric cap 22 may be formed by an etching process, such as reactive ion etching (RIE), that uses one or more etching chemistries to pattern the cap material layer and device layer 14 and that relies on the patterned resist layer as an etch mask. The etching process stops on the top surface 18a of the buried insulator layer 18. The resist layer is subsequently removed by, for example, oxygen plasma ashing or wet chemical stripping.

The device region 12 is comprised of semiconductor material originating from the device layer 14 and is covered by the dielectric cap 22 comprised of insulator from the cap material layer. Specifically, the device region 12 is constituted by a three-dimensional block of the semiconductor material of the device layer 14. The device region 12 has a top surface 12a, a bottom surface 12b that contacts the top surface 18a of the buried insulator layer 18, and exterior sidewalls 24 extending between the top and bottom surfaces 12a, 12b and encircling the device region 12 as an outer boundary. A corner 26, which represents an outer perimeter of the top surface 12a, is defined at the intersection between the sidewalls 24 and top surface 12a. Because of the buried insulator layer 18, adjacent fins 10 are fully isolated from each other and no additional isolation steps are required to provide the electrical isolation.

A doped region 28 may be formed as semiconductor material of a given conductivity type in the device region 12. In the representative embodiment, the doped region 28 is localized to occupy only a portion of the device region 12 and may extend to the outer perimeter defined by corner 26. The doped region 28 may be formed by forming by implanting ions of an impurity species into the device region 12 in the presence of a patterned mask applied to the top surface 12a of the device region 12. The mask controls dopant introduction into device region 12 during implantation by stopping the implanted ions within its thickness so that only a portion of the device region 12 is doped to form the doped region 28. The mask may be a resist layer having a window aligned with the intended location of the doped region 28 and formed in the mask using a photolithographic patterning process. The implantation conditions (e g, kinetic energy and dose) are selected to form the doped region 28 with a desired doping concentration (e.g., light doping). In a representative embodiment, the doped region 28 may be a lightly-doped n-well with the constituent semiconductor material having n-type conductivity supplied by implanting ions of an impurity species from Group V of the Periodic Table (e.g., phosphorus (P), arsenic (As), or antimony (Sb)). After ion implantation is complete, the mask is removed by, for example, oxygen plasma ashing or wet chemical stripping.

Figure 2:
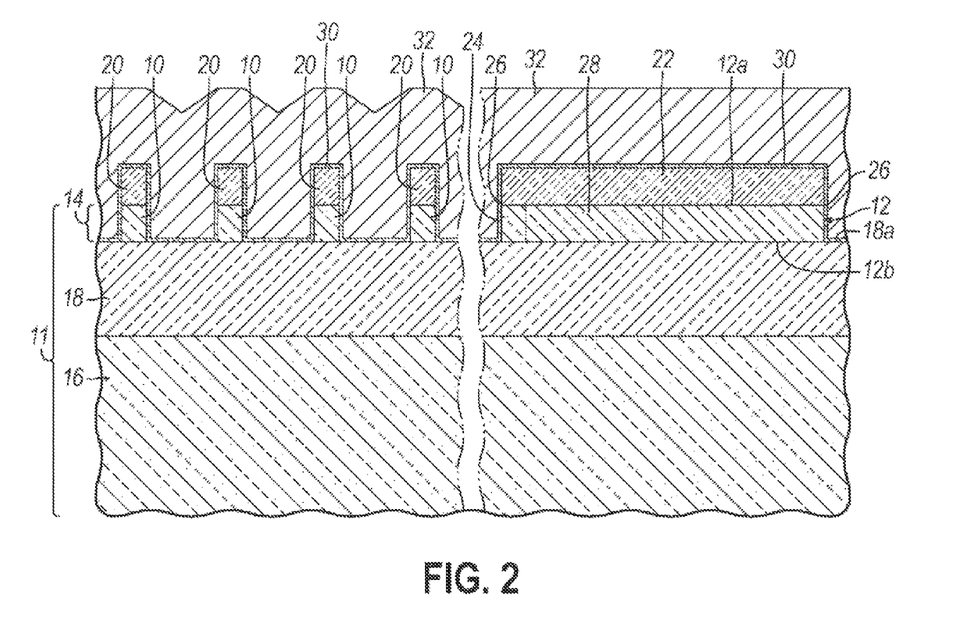

With reference to FIG. 2 in which like reference numerals refer to like features in FIG. 1 and at a subsequent fabrication stage, a gate dielectric layer 30 and a conductor layer 32 are applied across the SOI substrate 11. The conductor layer 32 is used in a subsequent fabrication stage of the processing method to form a mask used during the doping of the device region 12 to form the passive device structure. The conductor layer 32 is also used in the same subsequent fabrication stage to form one or more gates for the fins 10.

The gate dielectric layer 30 is comprised of an electrical insulator that has a dielectric constant (e.g., permittivity) characteristic of a dielectric material. In one embodiment, the gate dielectric layer 30 may be comprised of a high dielectric constant material with a relative permittivity (i.e., dielectric constant) above ten (10), which may include but are not limited to a metal oxide such as aluminum oxide ($Al_2O_3$), zirconium oxide ($ZrO_2$), tantalum pentoxide ($Ta_2O_5$), or hafnium oxide ($HfO_2$), a metal silicate such as a hafnium silicate ($HfSiO_4$) or hafnium oxynitride (HfSiON), or layered stacks of these and other similar materials. These types of electrical insulators may be deposited by atomic layer deposition (ALD), CVD, or another deposition technique. The conductor layer 32 is comprised of one or more layers of a material characterized by a high electrical conductivity. For example, the conductor layer 32 may be comprised of polycrystalline silicon (e.g., polysilicon) deposited by CVD or physical vapor deposition (PVD).

Figure 3:
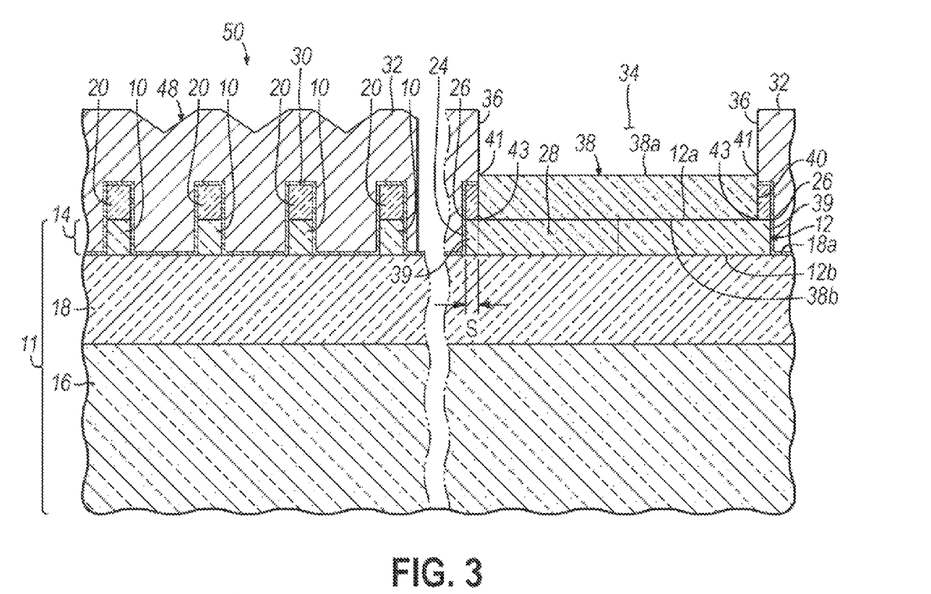

With reference to FIG. 3 in which like reference numerals refer to like features in FIG. 2 and at a subsequent fabrication stage, the gate dielectric layer 30 and conductor layer 32 are patterned to form a sacrificial mask layer having a window 34 that coincides with the location of the device region 12. The window 34, which exposes a portion but not all of the top surface 12a of the device region 12, has an outer perimeter defined by a sidewall 36. The sidewall 36 is inset inside of the corner 26 of the device region 12 so that the conductor layer 32, gate dielectric layer 30, and dielectric cap 22 overlap the device region 12 by a distance, S, and cover a peripheral edge 39 on the top surface 12a. The window 34 has a cross-sectional area that may be calculated in a plane that is parallel to the plane of the top surface 12a and this is smaller than the surface area of the top surface 12a.

An epitaxial layer 38 is formed inside the window 34 on the top surface 12a of the device region 12. The epitaxial layer 38 may be comprised of the same type of semiconductor material as the device region 12 and device layer 14. In one embodiment, the epitaxial layer 38 may be comprised of a semiconductor material (e.g., silicon) formed by an epitaxial growth process, such as vapor-phase epitaxy (VPE). Epitaxial growth is a process by which a layer of single-crystal material (epitaxial layer 38) is deposited or grown on a single-crystal substrate (the device region 12) and in which the crystallographic structure of the single-crystal substrate is reproduced in the epitaxial layer 38. As a result, the device region 12 and epitaxial layer 38 may have identical crystallographic structures.

The epitaxial layer 38 may be in situ doped during growth to introduce a concentration of an impurity or dopant to impart the same conductivity type as the doped region 28. For example, an additional source gas such as phosphine, arsine or diborane may be introduced into the growth chamber. Alternatively, the epitaxial layer may be ion implanted after growth to introduce an impurity or dopant that imparts the requisite conductivity type. In one embodiment, the semiconductor material constituting the epitaxial layer 38 may have n-type conductivity.

The epitaxial layer 38 may be considered to be an integral additive portion of the device region 12 so that the device region 12 and epitaxial layer 38 collectively comprise a single and complete piece of semiconductor material. The addition of the epitaxial layer 38 effectively thickens a central region of the device region 12 as delineated by the window 34. The epitaxial layer 38 has a top surface 38a that is elevated or raised relative to the respective top surfaces of the fins 10 and is also elevated or raised relative to a peripheral edge 39 of the top surface 12a of the device region 12. Hence, the central region of the device region 12 is effectively thicker than the fins 10, which retain the original thickness of the device layer 14.

The epitaxial layer 38 is a three-dimensional block of semiconductor material that has a top surface 38a, a bottom surface 38b that contacts the top surface 12a of the device region 12, and sidewalls 40 extending between the top and bottom surfaces 38a, 38b and encircling the epitaxial layer 38 as an outer boundary. The location of the sidewalls 40 is determined by inner perimeter of the window 34. A corner 41 of the epitaxial layer 38 is defined at the intersection between the sidewalls 40 and top surface 38a, and another corner 43 of the epitaxial layer 38 is defined at the intersection between the sidewalls 40 and bottom surface 38b. The corner 43 represents an outer perimeter of the bottom surface 38b and the corner 41 may also spatially coincide with the outer perimeter. The sidewalls 40 may be vertical so that the cross-sectional area of the epitaxial layer 38 may be invariant over the height.

The cross-sectional area of the window 34 in the gate dielectric layer 30 and conductor layer 32 is smaller than the surface area on the top surface 12a of the device region 12 that is coextensive with the epitaxial layer 38. The peripheral edge 39 on the top surface 12a of the device region 12, which is a consequence of this a real dimensional difference, is not covered by the epitaxial layer 38. As a result, the bottom surface 38b of the epitaxial layer 38 has a footprint on the top surface 12a of the device region 12 that exposes the peripheral edge 39 on the top surface 12a. The sidewalls 40 intersect the top surface 12a of the device region 12 such that the peripheral edge 39 of the device region 12 is a perimetric edge represented by a surface area that is positioned between the corners 26, 43 and that is exposed on the top surface 12a of the device region 12.

The peripheral edge 39 may extend about the outer perimeter of the device region 12 and, as mentioned above, has a width relative to the outer perimeter specified by the distance, S. Hence, the corner 43 of the epitaxial layer 38 and the corner 26 of the device region 12 may be laterally separated by the distance, S, about the entirety of their respective outer perimeters. In one embodiment, the distance, S, between the corners 26, 43 is dimensionally uniform about the respective outer perimeters of the device region 12 and epitaxial layer 38. The distance, S, also represents a distance over which the sidewalls 40 of the epitaxial layer 38 are inwardly offset relative to the sidewalls 24 of the device region 12 toward the center of the epitaxial layer 38.

In the representative embodiment, the patterning of the conductor layer 32 also forms a gate 56 for a FinFET 57, which is a single non-planar device structure constructed with multiple fins 10. The gate 56 is electrically insulated from the fins 10 by the gate dielectric layer 30 in a gate stack. Alternatively, the gate dielectric layer 30 and conductor layer 32 may be patterned to define multiple FinFETs each having an individual gate stack that overlaps at least one but not all of the fins 10. Additional FinFETs like FinFET 57 may be formed using fins similar to fins 10 in order to fabricate a FinFET-based integrated circuit on the SOI substrate 11.

In an alternative embodiment, the gate dielectric layer 30 and conductor layer 32 may be completely removed from the device region 12 during the patterning operation and replaced by an additive mask layer that is patterned to provide the window 34 used to define the outer peripheral boundaries of the epitaxial layer 38. The additive mask layer comprises a material that is deposited on the top surface 12a of the device region 12 before the epitaxial layer 38 is grown and after the gate dielectric layer 30 and conductor layer 32 are removed from the device region 12. For example, the additive mask layer may be a resist layer that is applied by spin coating, pre-baked, exposed in a lithography tool to radiation projected through a photomask to impart a latent image of the window 34, baked, and then developed with a chemical developer. The patterned mask layer has an appearance identical or substantially identical to the patterned gate dielectric layer 30 and conductor layer 32 in FIG. 3. The mask layer may be comprised of a layer of a dielectric material and, in particular, may be comprised of a material that is used in a CMOS process as a silicide blocking layer, such as a nitride, oxide, or oxynitride of silicon deposited by CVD or PVD. After the mask layer is formed, the growth of the epitaxial layer 38 on the device region 12 proceeds as described above.

Figure 4:
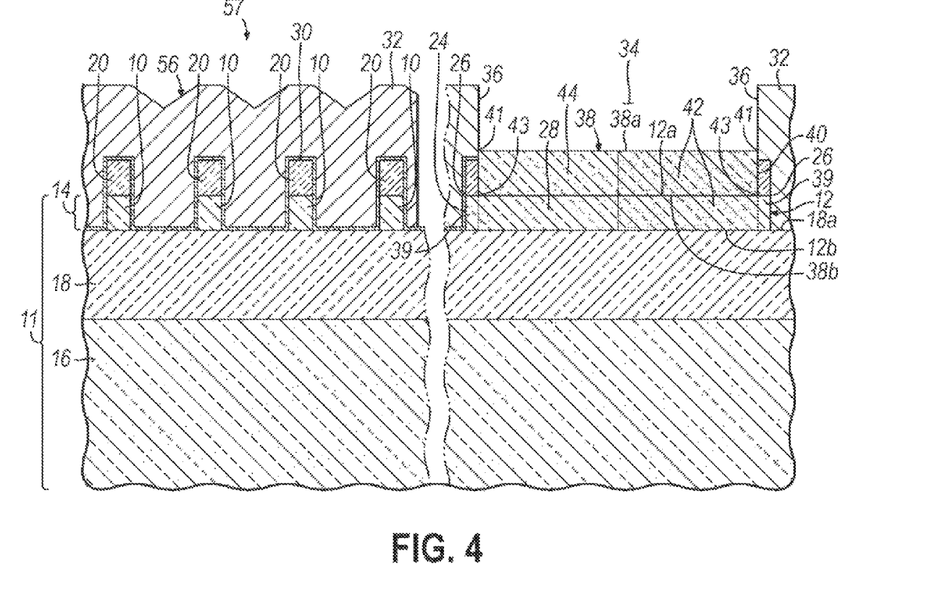

With reference to FIG. 4 in which like reference numerals refer to like features in FIG. 3 and at a subsequent fabrication stage, a doped region 42 is formed as a well of semiconductor material of the device region 12 after thickening with the addition of the epitaxial layer 38. The semiconductor material of the doped region 42 has a conductivity type that is opposite to the conductivity type of doped region 28. The doped region 42 may extend from the top surface 38a of the epitaxial layer 38 to the bottom surface 12b of the device region 12.

In the representative embodiment, the doped region 42 is localized to occupy only a portion of the device region 12 and a portion of the epitaxial layer 38 that is vertically stacked relative to the like doped portion of the device region 12. The doped region 42 may be formed by implanting ions of an impurity species into the device region 12 and epitaxial layer 38 through a patterned mask. The mask controls dopant introduction into device region 12 and epitaxial layer 38 during implantation by stopping the implanted ions in its thickness so that only respective portions of the device region 12 and epitaxial layer 38 are implanted to form the doped region 42. The mask may be a resist layer having a window aligned with the intended location of the doped region 42 and may be formed in the mask using a photolithographic patterning process. The implantation conditions (e g, kinetic energy and dose) are selected to form the doped region 42 with a desired depth profile for the doping concentration. In a representative embodiment, the doped region 42 may be a lightly-doped p-well with the p-type conductivity of the constituent semiconductor material supplied by implanting ions of an impurity species from Group III of the Periodic Table (e.g., boron (B), aluminum (Al), gallium (Ga), or indium (In)). After ion implantation is complete, the mask is removed by, for example, oxygen plasma ashing or wet chemical stripping.

The implanted ions dope a portion of the device region 12 and counterdope a portion of the epitaxial layer 38 previously doped to have the opposite conductivity type. As a result, the doped region 42 is partially formed in the epitaxial layer 38 and is partially formed in the device region 12. The counterdoping of the portion of the epitaxial layer 38 effectively defines a boundary for another doped region 44 in the epitaxial layer 38, which has the opposite conductivity type from the doped region 42 and the same conductivity type as doped region 28. Because of the common conductivity type, the doped regions 28, 44 collectively form another well that is oppositely doped to the well formed by the doped region 42 and that likewise extends from the bottom surface 12b of the device region 12 to the top surface 38a of the epitaxial layer 38. The well defined by doped regions 28, 44 is adjacent to the well of opposite conductivity type defined by doped region 42 and these wells have a juxtaposed relationship.

The well collectively defined by doped regions 28,44 and the well defined by doped region 42 are comprised of lightly-doped semiconductor material. As used herein, the dopant concentration in semiconductor material that is considered heavily doped may be at least an order of magnitude higher than the dopant concentration in semiconductor material that is considered lightly doped. The relative dopant concentrations for heavily-doped semiconductor material and lightly-doped semiconductor material are understood by a person having ordinary skill in the art. For example, a representative dopant concentration for heavily-doped semiconductor material may be greater than or equal to $10^{18}$ cm$^{-3}$, and a representative dopant concentration for lightly-doped semiconductor material may be less than or equal to $10^{16}$ cm$^{-3}$.

Figure 5:
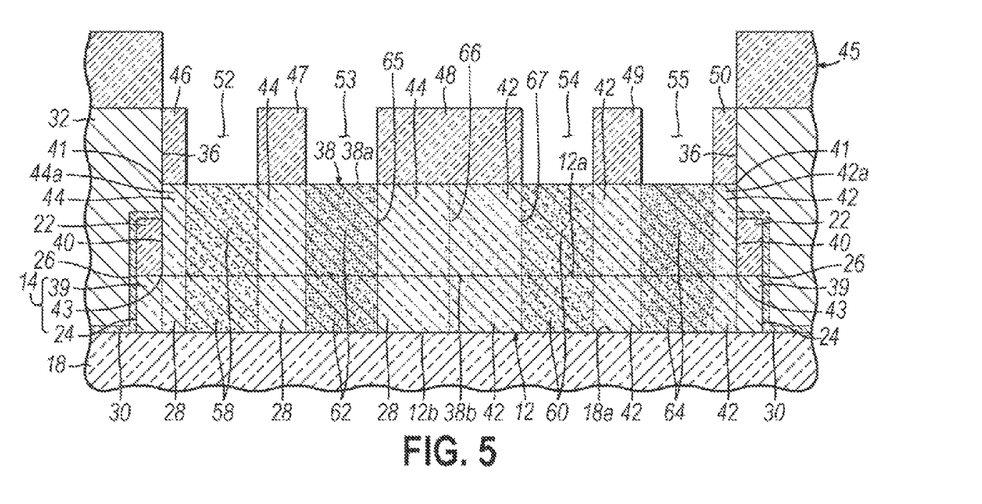
FIG. 5 is a cross-sectional view of a device structure for a passive device formed using one of the substrate portions in FIG. 4 at a subsequent fabrication stage of the processing method.
Figure 6:
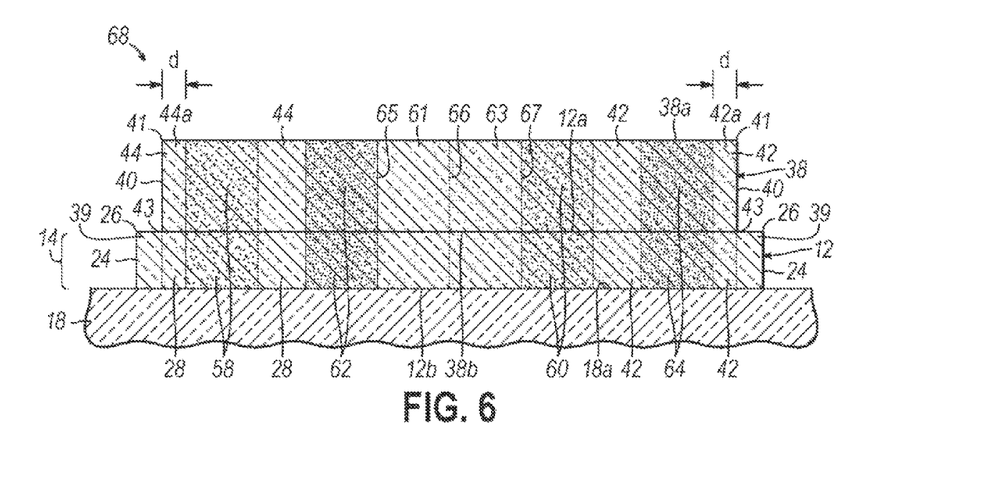
FIG. 6 is a cross-sectional view of the device structure of FIGS. 5, 5A at a subsequent fabrication stage of the processing method.

With reference to FIGS. 5, 6 in which like reference numerals refer to like features in FIG. 4 and at a subsequent fabrication stage, a mask layer 45 is applied to the top surface 12a of the device region 12 and patterned using a resist layer applied on the mask layer 45 by spin coating. The resist layer is pre-baked, exposed to radiation projected through a photomask to impart a latent image pattern, baked, and then developed with a chemical developer to define residual areas of resist that mask portions of the mask layer 45. The image pattern is transferred from the resist layer to the mask layer 45 by an anisotropic dry etch process, such as RIE. The resist layer is removed by ashing or solvent stripping.

The mask layer 45 may be comprised of a sacrificial material, such as SiO$_2$, that etches selectively to the semiconductor material of the device region 12. The mask layer 45 includes a plurality of strips 46, 47, 48, 49, 50 that are aligned parallel to each other and separated by respective openings 52-55.

Doped regions 58, 60 are formed in the device region 12 and epitaxial layer 38 following the formation of a patterned mask layer. Doped region 58, which is laterally disposed within the lightly-doped regions 28, 44, is comprised of semiconductor material having the same conductivity type as doped regions 28, 44 but with a higher doping concentration and a higher electrical conductivity (i.e., lower electrical resistivity). Doped region 60, which is laterally disposed within doped region 42, is comprised of semiconductor material having an opposite conductivity type from doped region 42.

In the representative embodiment, the doped regions 58, 60 may be concurrently formed by ion implantation. To that end, at least openings 53, 55 are covered by the patterned mask and ions of an impurity species are implanted through openings in the mask. The mask may be a resist layer having openings aligned with the intended locations for the doped regions 58, 60 and formed using a photolithographic patterning process with a thickness sufficient to stop the implanted ions. The implantation conditions for forming doped regions 58, 60 are selected to provide a desired depth profile for the doping concentration and may include multiple implantation conditions. In one embodiment, the doped regions 58, 60 may be provided with n-type conductivity by implanting ions of a suitable n-type impurity species. The semiconductor material of the device region 12 aligned with openings 53, 55 does not receive a concentration of the implanted ions because of blocking by the mask, which stops the ions within its thickness. After ion implantation is complete, the mask is removed.

Doped regions 62, 64 may also be formed within the device region 12 and epitaxial layer 38 either before or after the formation of doped regions 58, 60. Doped region 62, which is laterally disposed in the well defined by the doped regions 28, 44, is comprised of semiconductor material having an opposite conductivity type from doped regions 28, 44. Doped region 64, which is laterally disposed within the well defined by doped region 42, is comprised of semiconductor material having the same conductivity type as doped region 42 but with a higher doping concentration and a higher electrical conductivity (i.e., lower electrical resistivity).

In the representative embodiment, the doped regions 62, 64 may be concurrently formed by ion implantation. To that end, at least openings 52, 54 in the mask layer 45 are covered by a patterned mask and ions of an impurity species are implanted through openings in the mask. The mask may be a resist layer having openings aligned with the intended locations for the doped regions 62, 64 and formed using a photolithographic patterning process. The implantation conditions for forming doped regions 62, 64 are selected to provide a desired depth profile for the doping concentration and may include multiple implantation conditions. In a representative embodiment, the doped regions 62, 64 may be provided with p-type conductivity by implanting ions of a suitable p-type dopant. The semiconductor material of the device region 12 aligned with openings 52, 54 does not receive a concentration of the implanted ions because of blocking by the mask, which stops the ions within its thickness. After ion implantation is complete, the mask is removed.

Figure 5A:
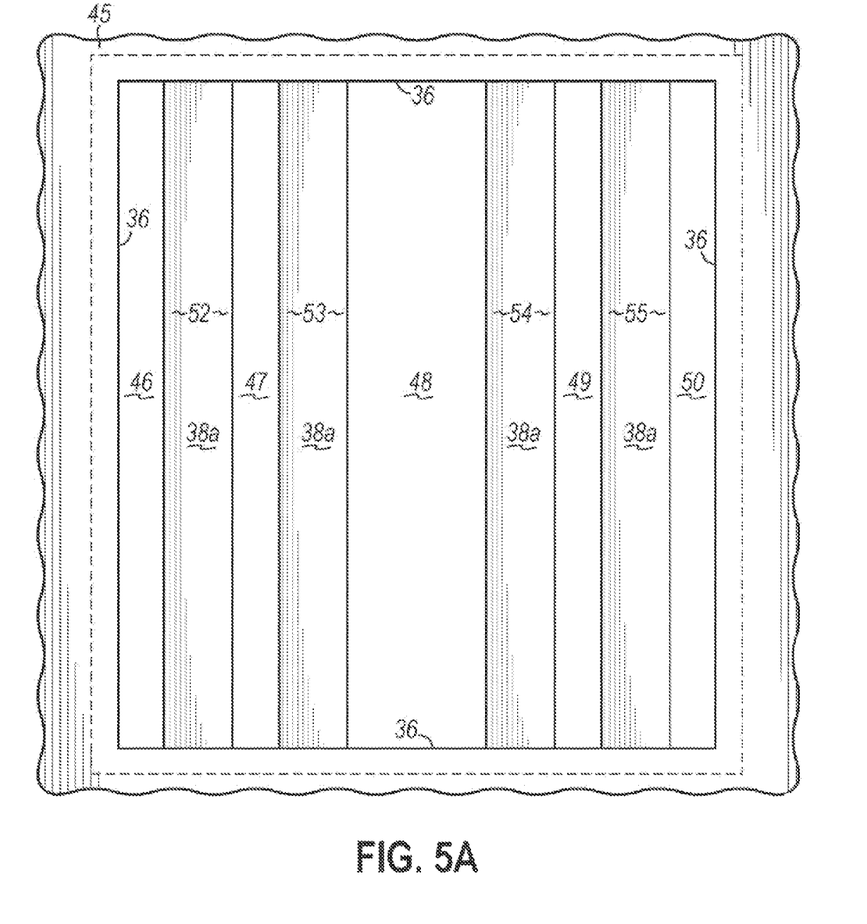
FIG. 5A is a top view of the device structure of FIG. 5.
Figure 7:
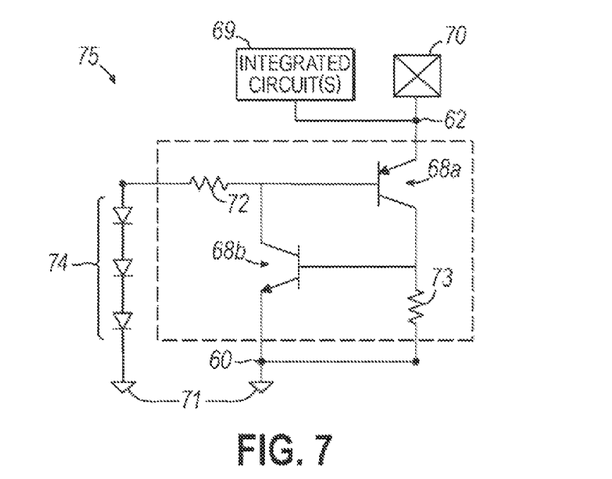
FIG. 7 is a schematic view of an electrical configuration for the device structure of FIG. 6.

With reference to FIGS. 6, 7 in which like reference numerals refer to like features in FIGS. 5, 5A and at a subsequent fabrication stage, the mask layer 45 and the remnants of the dielectric cap 22, gate dielectric layer 30, and conductor layer 32 proximate to the device region 12 and epitaxial layer 38 may be removed by etching. The FinFET 57 is masked during the removal. The device region 12 and epitaxial layer 38, as well as the doped regions 28, 42, 44, 58, 60, 62, 64 in the device region 12 and epitaxial layer 38, are unaffected by the etching. An anneal, such as a rapid thermal anneal, may be employed to electrically activate the implanted impurity species and to alleviate any implantation damage in doped regions 28, 42, 58, 60, 62, 64.

A passive device 68, which is a silicon controlled rectifier (SCR) in the representative embodiment, is provided as a lateral, planar four-layer structure of alternating conductivity types and three p-n junctions 65, 66, 67 across which the conductivity type of the layered semiconductor material changes. The SCR represented by the passive device 68 is comprised of cross-coupled parasitic PNP and NPN bipolar transistors 68a, 68b (FIG. 7). The p-n junction 65 is defined along an interface between a portion 61 of doped regions 28, 44 and the doped region 62. This p-n junction 65 produced by the abutment of the doped regions 28, 44 and the doped region 62 also represents the junction for a diode. The p-n junction 66 is defined along an interface between the portion 61 of doped regions 28, 44 and a portion 63 of doped region 42. The p-n junction 67 is defined along an interface between the portion 63 of doped region 42 and doped region 60. This p-n junction 67 produced by the abutment of doped regions 42, 60 also represents the junction for a diode.

Doped region 62 may represent an anode of the passive device 68, and doped region 60 may represent a cathode of the passive device 68. The doped region 58 provides a body contact, which in the representative embodiment is an n-body contact that contacts the n-well represented by doped regions 28, 44. The doped region 64 provides another body contact, which in the representative embodiment is a p-body contact that contacts the p-well represented by doped region 42.

The passive device 68 may be used as a protection element in an electrostatic discharge (ESD) protection circuit 75 configured to discharge current from an ESD pulse or, alternatively, the passive device 68 may be used in a different type of circuit that does not involve ESD protection.

In use as a protection element of the ESD protection circuit 75, the passive device 68 and one or more protected integrated circuits 69 may be electrically coupled by a common signal path to an input/output (I/O) pad 70. More specifically, the doped region 62 (i.e., the anode of the passive device 68) may be coupled with the I/O pad 70 and the protected integrated circuits 69 and the doped region 60 (i.e., the cathode of the passive device 68) may be coupled to the ground buss at a ground pad 71, which is grounded when the protected integrated circuits 69 are not powered. The well defined by doped regions 28, 44 and the oppositely-doped well defined by doped region 42 define resistances 72, 73.

The one or more protected integrated circuits 69 may include the FinFET 57 formed using the fins 10 and other similar FinFETs. When the protected integrated circuits 69 are powered, the passive device 68 of the ESD protection circuit 75 will present a high impedance between the I/O pad 70 and the ground buss at ground pad 71 so that signals communicated over the signal path between the I/O pad 70 and the integrated circuits 69 are largely unaffected by the presence of the passive device 68.

The gate of the PNP bipolar transistor 68a is coupled with a drive circuit 74, which may be a diode string. The drive circuit 74 of the ESD protection circuit 75 responds to the voltage from an ESD pulse by triggering the passive device 68 to enter a low-impedance conducting state and thereby provide a current-carrying path for the ESD current from the I/O pad 70 to the ground pad 71. The current-carrying path includes the doped regions 60, 62 and the portions of doped regions 28, 44 and doped region 42 respectively between doped regions 60, 62. When triggered, the passive device 68 is induced to enter the low-impedance conducting state by the ESD pulse and thereby divert the ESD pulse through the current-carrying path and away from the protected integrated circuits 69. In response to the ESD current flowing through the passive device 68, the bipolar transistors 68a, 68b hold each other in the low-impedance conducting state and the low-impedance conducting state persists. At the conclusion of the ESD event, the passive device 68 reverts to the high-impedance non-conducting state and remains off until a trigger signal is applied in response to a future ESD event.

The doped regions 42, 58, 60, 62, 64 and doped regions 28, 44 of the passive device 68 may extend vertically in depth from the top surface 38a of the epitaxial layer 38 to the bottom surface 12b of the device region 12, which is coextensive with the top surface 18a of buried insulator layer 18. Doped region 42 includes a portion 42a that is laterally positioned between the doped region 64 and the nearest exterior sidewalls 40 of the epitaxial layer 38. Doped region 44 includes a portion 44a that is laterally positioned between the doped region 58 and the nearest exterior sidewalls 40 of the epitaxial layer 38. These portions 42a, 44a, are also laterally positioned between the nearest exterior sidewalls 24 of the device region 12 and the doped regions 42, 44, and operate as guard structures that collect stray carriers.

The doped regions 58, 60, which are comprised of heavily-doped semiconductor material, are interiorly positioned inside the doped region 28 that is comprised of lightly-doped semiconductor material. The doped regions 62, 64, which are also comprised of heavily-doped semiconductor material of the opposite conductivity type, are interiorly positioned inside the doped region 42 that is comprised of lightly-doped semiconductor material. Specifically, the doped regions 58, 60, 62, 64 may be spaced inward from the exterior sidewalls 40 and corner 41 of the epitaxial layer 38 (i.e., the outer perimeter of the top surface 38a). In particular, the distance, d, between doped region 58 and the nearest-neighbor sidewall 40 and corner 41 includes the portion 44a of doped region 33, and the distance, d, between doped region 64 and the nearest-neighbor sidewall 40 and corner 41 includes the portion 42a of doped region 42. As a result, doped region 58 is separated from its nearest-neighbor sidewall 40 and corner 41 by lightly-doped semiconductor material of one conductivity type and doped region 64 is separated from its nearest-neighbor sidewall 40 and corner 41 by lightly-doped semiconductor material of the opposite conductivity type.

This intentional inward spacing by distance, d, may provide spatial clearance to account for uncertainty in the physical location of the doped regions 58, 60, 62, 64. The intentional inward spacing may also enhance the electrical control over the passive device 68 by supplying a guard structure between the doped regions 58, 60, 62, 64 and the corner 41.

The passive device 68 is formed on the same SOI substrate 11 as the FinFET 57, and the FinFET 57 and passive device 68 both utilize semiconductor material originating from the device layer 14 in their construction. The passive device 68 is electrically isolated from the FinFET 57 by the buried insulator layer 18 and without the aid of lateral isolation structures, such as shallow trench isolation regions. Standard processing follows the formation of the passive device 68 to provide contacts to the various doped regions 58, 60, 62, 64 and a back-end-of-line (BEOL) interconnect structure.

Figure 8:
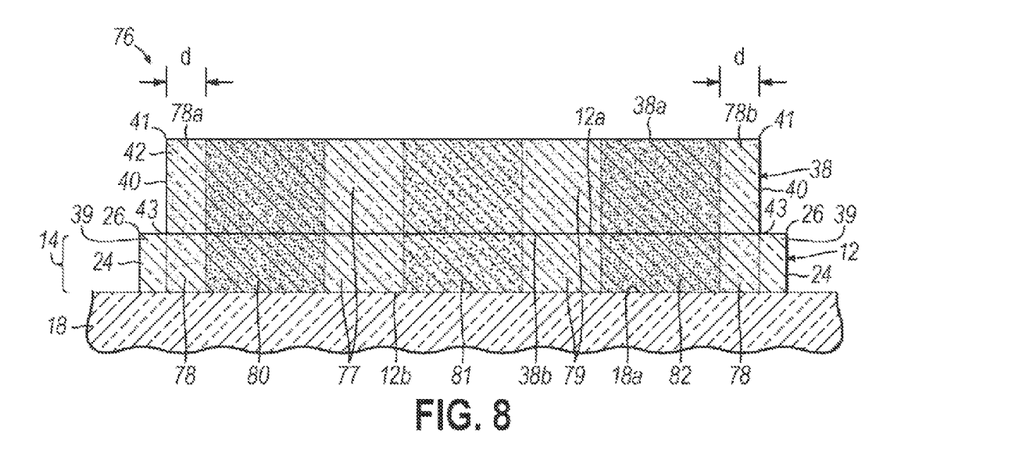
FIGS. 8 and 9 are cross-sectional views similar to FIG. 6 of device structures for a passive device constructed in accordance with alternative embodiments of the invention.

With reference to FIG. 8 in which like reference numerals refer to like features in FIG. 6 and in accordance with an alternative embodiment, a passive device 76 may be formed using the device region 12 and epitaxial layer 38 that differs from the passive device 68 (FIG. 6). Specifically, the formation of the doped region 28 may be omitted from the process flow and the formation of the doped region 42 may be altered such that a lightly-doped region 78 analogous to doped region 42 is formed in the epitaxial layer 38 and device region 12. As a result, the lightly-doped region 78 represents a well of a single conductivity type within the epitaxial layer 38 and device region 12 that is used for device formation.

The process flow used to form the passive device 68 is also altered in connection with the formation of the heavily-doped regions 58, 60, 62, 64 such that only three heavily-doped regions 80, 81, 82 are formed in the epitaxial layer 38 and device region 12. To that end, the mask layer 45 (FIGS. 5, 5A) is altered to reduce the number of strips 46-50 and the number of openings 52-55 by unity so that only four strips and three openings are present. The locations and arrangement of the strips determines the location and arrangement of the doped regions 80, 81, 82.

The doped regions 80, 82 are formed by an impurity introduction process, such as ion implantation, while the doped region 81 is masked. Doped regions 80, 82 are comprised of semiconductor material having the same conductivity type as the doped region 78 and are used to supply well contacts. Doped region 81 is formed by an impurity introduction process, such as ion implantation, while the doped regions 80, 82 are masked. Doped region 81 is laterally disposed between the doped regions 80, 82 and is comprised of semiconductor material having an opposite conductivity type from the semiconductor material of doped region 78.

A portion 78a of doped region 78 may be laterally positioned between doped region 80 and the nearest-neighbor sidewall 40 and corner 41 of the epitaxial layer 38. A portion 78b of doped region 78 may be laterally positioned between doped region 82 and the nearest-neighbor sidewall 40 and corner 41 of the epitaxial layer 38. Portions 77, 79 of the doped region 78 may form a p-n junction with the doped region 81.

The doped regions 80, 81, 82 of heavily-doped semiconductor material may be spaced inward from the sidewall 40 and corner 41. In particular, the distance, d, between doped region 80 and the nearest-neighbor sidewall 40 and corner 41 is occupied by the portion 78a of well 78, and the distance, d, between doped region 82 and the nearest-neighbor sidewall 40 and corner 41 is occupied by the portion 78b of well 78. As a result, doped region 80 and the doped region 82 are each separated from its nearest-neighbor sidewall 40 and corner 41 by lightly-doped semiconductor material of the same conductivity type.

In one embodiment, the doped region 78 may be comprised of lightly-doped n-type semiconductor material to define an n-well, the doped regions 80, 82 may be comprised of heavily-doped n-type semiconductor material, and the doped region 81 may be comprised of heavily-doped p-type semiconductor material. This arrangement of oppositely doped layers defines a lateral, planar $p^+$/n-well diode as the passive device 76. In another embodiment, the doped region 78 may be comprised of lightly-doped p-type semiconductor material to define a p-well, the doped regions 80, 82 may be comprised of heavily-doped p-type semiconductor material, and the doped region 81 may be comprised of heavily-doped n-type semiconductor material. This layered arrangement defines a lateral, planar $n^+$/p-well diode as the passive device 76. Doped region 81 serves as a cathode for both types of diodes, doped region 78 serves as an anode for both types of diodes, and the doped regions 78, 81 are butted to define a p-n junction.

Similar to passive device 68, the passive device 76 may be utilized as an ESD protection element in an ESD protection circuit. Alternatively, the passive device 76 may be used in a different type of circuit that does not involve ESD protection.

Figure 9:
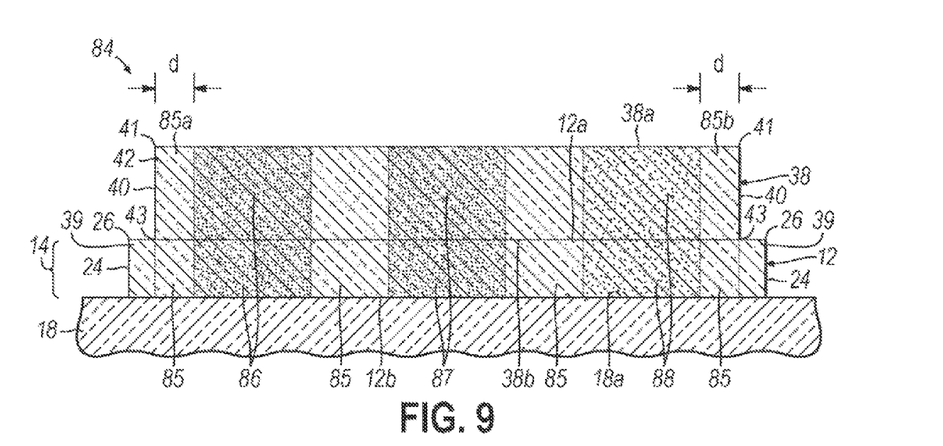

With reference to FIG. 9 in which like reference numerals refer to like features in FIG. 6 and in accordance with an alternative embodiment, a passive device 84 may be formed using the device region 12 and epitaxial layer 38 that differs from the passive device 76 (FIG. 8), as well as from the passive device 68 (FIG. 6). Similar to the process flow forming passive device 76, the doped region 28 is omitted from the process flow and a lightly-doped region 85 analogous to lightly-doped region 42 is formed in the epitaxial layer 38 and device region 12. As a result, the lightly-doped region 85 represents a well of a single conductivity type within the epitaxial layer 38 and device region 12 that is used for device formation.

Also similar to the process flow used to form the passive device 76, only three heavily-doped regions 86, 87, 88 are formed in the epitaxial layer 38 and device region 12. As discussed above in connection with the formation of passive device 76, this modification is accomplished by altering the mask layer 45 (FIGS. 5, 5A) to reduce the number of strips 46-50 and the number of openings 52-55 by unity so that only four strips and three openings are present. The locations and arrangement of the strips determines the location and arrangement of the doped regions 86, 87, 88.

The doped regions 86, 87 are formed by an impurity introduction process, such as ion implantation, while the doped region 88 is masked. The doped regions 86, 87 are comprised of semiconductor material having an opposite conductivity type from the doped region 85 and are laterally adjacent to each other. As a result, a p-n junction is defined along an interface between a portion of doped region 85 and doped region 86 across which the conductivity type changes and another p-n junction is defined along an interface between the same portion of doped region 85 and doped region 87 across which the conductivity type changes. The doped region 88 is formed by an impurity introduction process, such as ion implantation, while the doped regions 85, 87 are masked. The doped region 88 is comprised of semiconductor material having the same conductivity type as the doped region 85 and is used to supply a well contact.

A portion 85a of doped region 85 may be laterally positioned between doped region 86 and the nearest-neighbor sidewall 40 and corner 41 of the epitaxial layer 38. A portion 85b of doped region 85 may be laterally positioned between doped region 88 and the nearest-neighbor sidewall 40 and corner 41 of the epitaxial layer 38. The doped regions 86, 87, 88 of heavily-doped semiconductor material may be spaced inward from the sidewall 40 and corner 41. In particular, the distance, d, between doped region 86 and the nearest-neighbor sidewall 40 and corner 41 is occupied by the portion 85a of well 85, and the distance, d, between doped region 88 and the nearest-neighbor sidewall 40 and corner 41 is occupied by the portion 85b of well 85. As a result, doped region 86 and the doped region 88 are each separated from its nearest-neighbor sidewall 40 and corner 41 by lightly-doped semiconductor material of the same conductivity type.

In one embodiment, the doped region 85 may be comprised of lightly-doped p-type semiconductor material to define a p-well, the doped regions 86, 87 may be comprised of heavily-doped n-type semiconductor material, and the doped region 88 may be comprised of heavily-doped p-type semiconductor material. This arrangement of oppositely doped layers defines a three-terminal lateral, planar NPN bipolar junction transistor as the passive device 84. The doped regions 86 and 87 define the emitter and collector of the NPN bipolar junction transistor and the portion of doped region 85 between the doped regions 86, 87 defines the base of the NPN bipolar junction transistor. The p-n junction between the n-type collector and the p-type base is the collector-base junction that has the base as the anode and the collector as the cathode. The p-n junction between the n-type emitter and the p-type base is the emitter-base junction that has the base as the anode and the emitter as the cathode.

In another embodiment, the doped region 85 may be comprised of lightly-doped n-type semiconductor material to define a p-well, the doped regions 86, 87 may be comprised of heavily-doped p-type semiconductor material, and the doped region 88 may be comprised of heavily-doped n-type semiconductor material. This arrangement of oppositely doped layers defines a lateral, planar PNP bipolar junction as the passive device 84.

Similar to passive device 68, the passive device 84 may be employed as an ESD protection element in an ESD protection circuit. Alternatively, the passive device 84 may be used in a different type of circuit that does not involve ESD protection.

Figure 10:
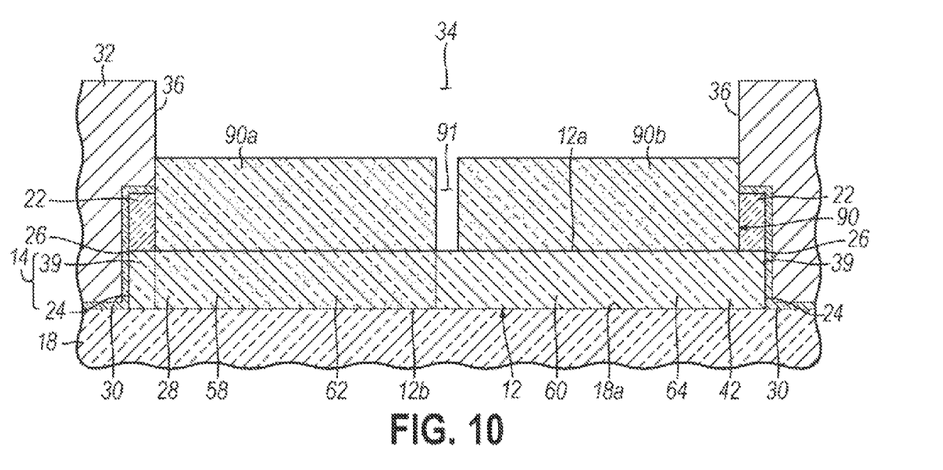
FIGS. 10 and 11 are cross-sectional views similar to FIG. 3 of substrate portions that may be used to form device structures for a passive device in accordance with alternative embodiments of the invention.

With reference to FIG. 10 in which like reference numerals refer to like features in FIG. 3 and in accordance with an alternative embodiment, an epitaxial layer 90 is formed that differs from the epitaxial layer 38 in that the epitaxial layer is divided into a plurality of sections 90a, 90b that each effectively increase the local thickness of the device layer 14. A patterned resist layer is applied prior to the epitaxial growth process used to form the epitaxial layer 90. In this instance, a strip of the patterned resist is disposed on the top surface of the device layer 14 to fill a gap 91 that is eventually disposed between the epitaxial sections 90a, 90b when the patterned resist is removed. The epitaxial semiconductor material of the epitaxial layer 90 is prevented from growing in the gap 91 because of blocking by the resist strip, which results in the sectioning of the epitaxial layer 90 into parallel fingers defined by sections 90a, 90b. Additional strips of patterned resist may be provided so that more than two gaps like gap 91 and, hence, more than two epitaxial sections 90a, 90b are produced by the masking. The process flow may continue as described hereinabove to form at least one of the passive devices 68, 76, 84 in each of the sections 90a, 90b.

Figure 11:
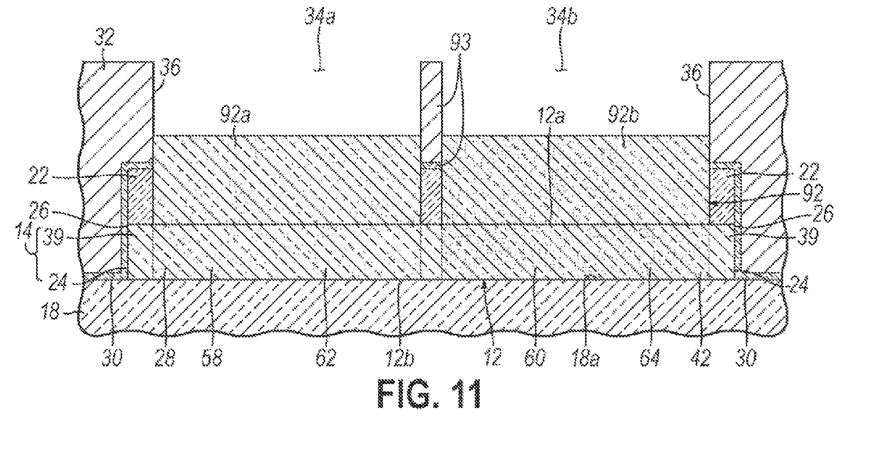

With reference to FIG. 11 in which like reference numerals refer to like features in FIG. 3 and in accordance with an alternative embodiment, an epitaxial layer 92 is formed that differs from the epitaxial layer 38 in that the epitaxial layer is divided into a plurality of sections 92a, 92b that each effectively increase the local thickness of the device layer 14. The epitaxial layer 92 is formed by a modification to the patterning of the gate dielectric layer 30 and conductor layer 32 as described above in connection with FIG. 3. A strip 93 of the patterned gate dielectric layer 30 and conductor layer 32 is retained inside the window 34 and functions to divide the window 34 into two separate and distinct windows 34a, 34b. In this instance, the strip 93 of the patterned gate dielectric layer 30 and conductor layer 32 is disposed on the top surface 14a of the device layer 14 and occupies a space that eventually defines a gap disposed between the epitaxial sections 92a, 92b when the gate dielectric layer 30 and conductor layer 32 are patterned. Strip 93 blocks the growth of the epitaxial semiconductor material, which results in the sectioning of the epitaxial layer 92 into sections 92a, 92b. The windows 34a, 34b may be nominally equal in dimensions, as shown in the representative embodiment, or may have different dimensions. Additional strips like strip 93 may be provided so that more than two windows 34a, 34b and, hence, more than two epitaxial sections 92a, 92b are produced by the masking. The process flow may continue as described hereinabove to form at least one of the passive devices 68, 76, 84 in each of the sections 92a, 92b.

Figure 12:
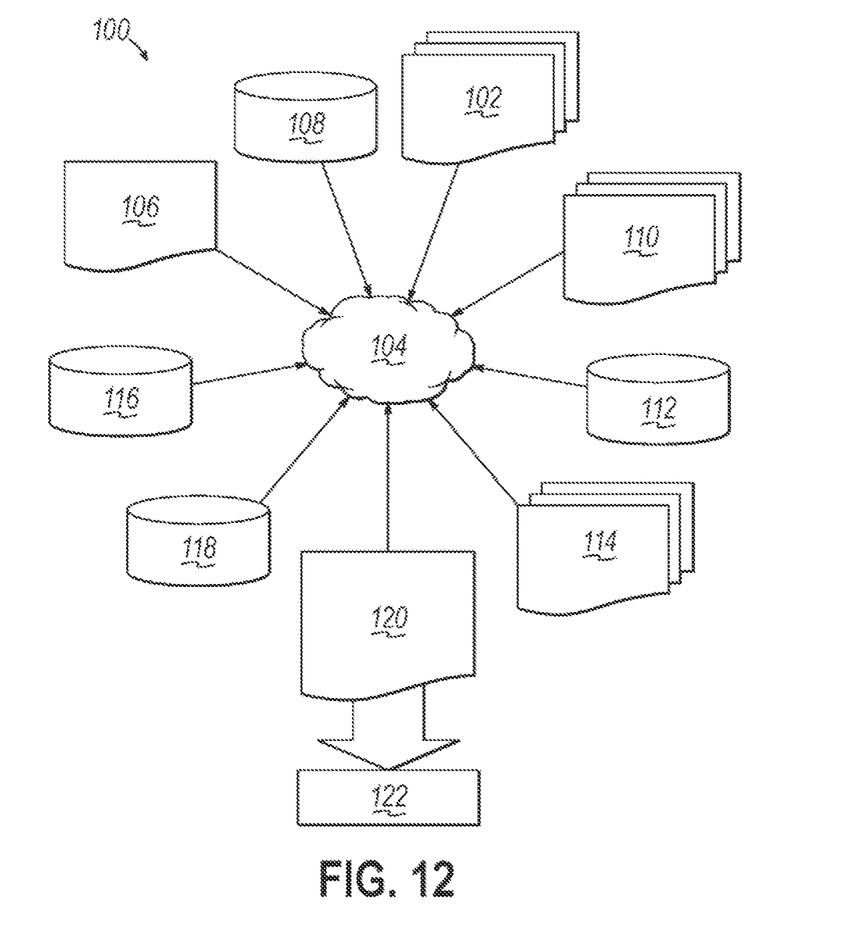
FIG. 12 is a flow diagram of a design process used in semiconductor design, manufacture, and/or test.

FIG. 12 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 6-11. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 6-11. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 6-11 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 6-11. In one embodiment, design structure 120 may comprise a compiled, executable HDL simulation model that functionally simulates the devices shown in FIGS. 6-11.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 6-11. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure fabricated using a device layer of a semiconductor-on-insulator substrate, the device structure comprising:
    a device region comprised of a first portion of the device layer, the device region having an exterior sidewall;
    an epitaxial layer on the device region, the epitaxial layer including an exterior sidewall spaced from the exterior sidewall of the device region;
    a first well of a first conductivity type in the epitaxial layer and the device region; and
    a first doped region of a second conductivity type in the first well that defines a first junction with a first portion of the first well.

2. The device structure of claim 1 wherein a second portion of the first well is positioned between the first doped region and the exterior sidewall of the epitaxial layer.

3. The device structure of claim 2 further comprising:
    a second doped region in the first well, the second doped region positioned between the first junction and the exterior sidewall of the device region, and the second portion of the first well positioned between the second doped region and the exterior sidewall of the device region.

4. The device structure of claim 3 wherein the second doped region has the second conductivity type.

5. The device structure of claim 3 wherein the second doped region has the first conductivity type and a higher dopant concentration than the first well.

6. The device structure of claim 1 further comprising:
    a second well of the second conductivity type in the epitaxial layer and the device region; and
    a first doped region of the first conductivity type in the second well, the first doped region and a portion of the second well defining a second junction,
    wherein the portion of the second well is juxtaposed with the first portion of the first well to define a third junction, and the first doped region of the second conductivity type, the first portion of the first well, the portion of the second well, and the first doped region of the first conductivity type define a planar silicon controlled rectifier.

7. The device structure of claim 1 further comprising:
    a second doped region of the second conductivity type in the first well,
    wherein the first doped region, the first portion of the first well, and the second doped region define a lateral bipolar junction transistor.

8. The device structure of claim 1 wherein the first portion of the first well and the first doped region define a planar diode.

9. The device structure of claim 1 further comprising:
    a fin-type field-effect transistor including at least one fin comprised of a second portion of the device layer of the semiconductor-on-insulator substrate.

10. The device structure of claim 9 wherein the semiconductor-on-insulator substrate further includes a buried insulator layer, the device region and the at least one fin each have a bottom surface that directly contacts the buried insulator layer, and the device layer is absent between the device region and the at least one fin so that the buried insulator layer electrically isolates the device region from the at least one fin.

11. An electrostatic discharge protection circuit comprising:
    the device structure of claim 1;
    a protected integrated circuit;
    a ground pad; and
    an input/output pad coupled with the protected integrated circuit,
    wherein the device structure is coupled between the input/output pad and the ground pad.

12. A design structure readable by a machine used in design, manufacture, or simulation of an integrated circuit, the design structure comprising:
    a device region comprised of a portion of a device layer of a semiconductor-on-insulator substrate, the device region having an exterior sidewall;
    an epitaxial layer on the device region, the epitaxial layer including an exterior sidewall spaced from the exterior sidewall of the device region;
    a well of a first conductivity type in the epitaxial layer and the device region; and
    a doped region of a second conductivity type in the well that defines a junction with a portion of the well.

13. The design structure of claim 12 wherein the design structure comprises a netlist.

14. The design structure of claim 12 wherein the design structure resides on storage medium as a data format used for the exchange of layout data of integrated circuits.

15. The design structure of claim 12 wherein the design structure resides in a programmable gate array.

* * * * *